United States Patent [19]

Kawashima et al.

[11] 4,236,165
[45] Nov. 25, 1980

[54] PLANAR SEMICONDUCTOR DEVICE

[75] Inventors: Mitsuo Kawashima, Higashi-Kurume; Kimihiro Ohta, Mitaka; Shoei Kataoka, Tanashi, all of Japan

[73] Assignee: Agency of Industrial Science & Technology, Ministry of International Trade & Industry, Tokyo, Japan

[21] Appl. No.: 966,626

[22] Filed: Dec. 5, 1978

[30] Foreign Application Priority Data

Jun. 2, 1978 [JP] Japan ................................ 53-65701

[51] Int. Cl.$^3$ .......................................... H01L 29/161
[52] U.S. Cl. ...................................... 357/16; 357/30; 357/3; 357/22; 357/61

[58] Field of Search ................... 397/16, 30, 3, 22, 61

[56] References Cited

U.S. PATENT DOCUMENTS 4,015,284  3/1977  Hara ........................................ 357/16

Primary Examiner—Martin H. Edlow
Attorney, Agent, or Firm—Oblon, Fisher, Spivak, McClelland & Maier

[57] ABSTRACT

Planar semiconductor device including a crystalline layer of $Ga_xAl_{1-x}Sb$ compound semiconductor ($0.1 < x < 0.3$) grown on a GaSB substrate and a narrow energy band gap semiconductor grown as an active layer on the crystalline layer and having electrodes formed on the active layer in the planar form.

6 Claims, 13 Drawing Figures

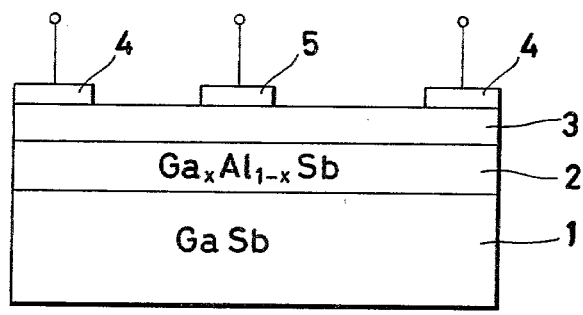
Fig_1
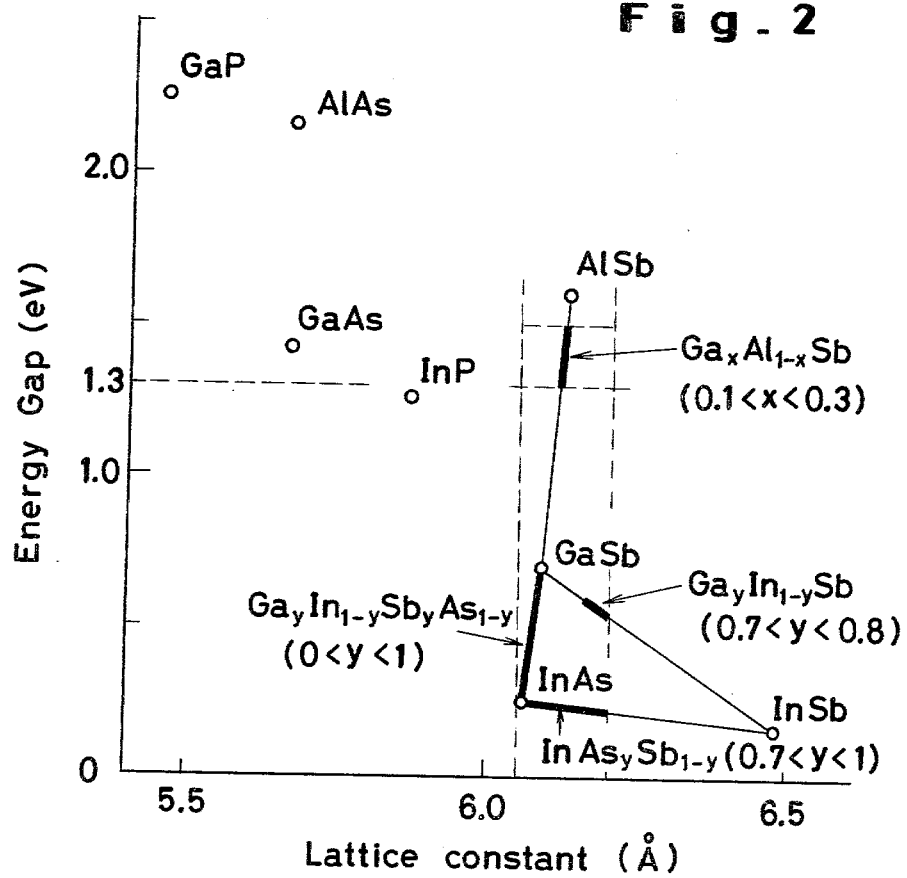
Fig_2

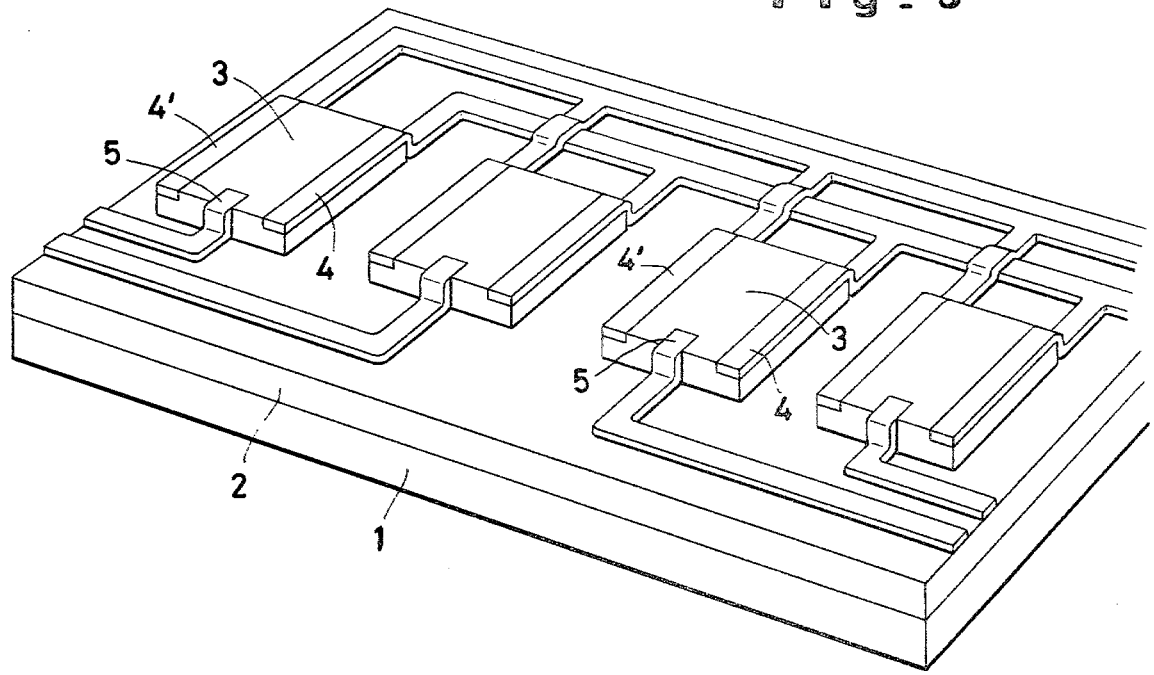
Fig_3
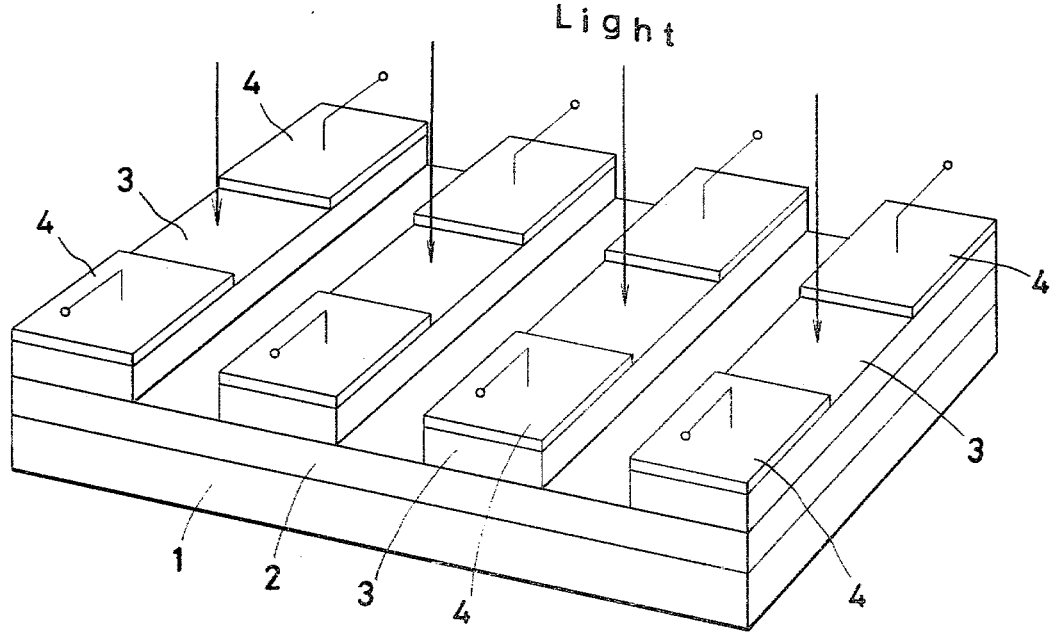
Fig_4

Fig_9
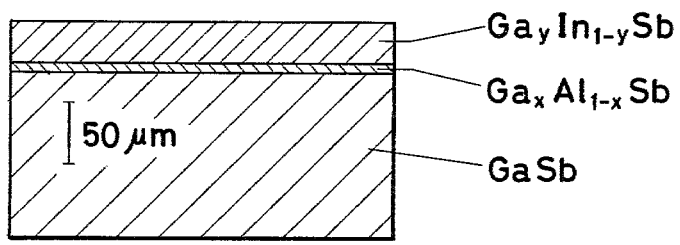
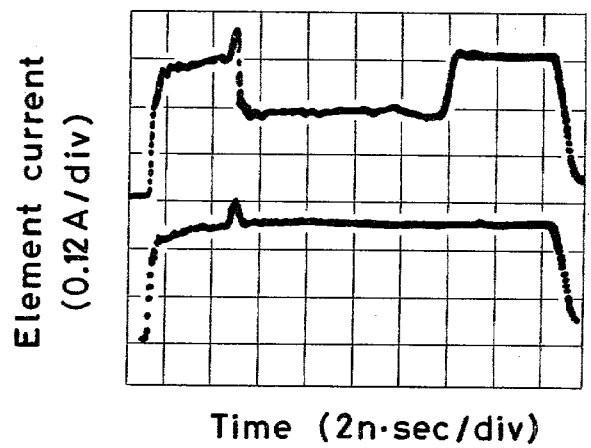
Fig_10 (A)
Fig_10 (B)
Fig_11
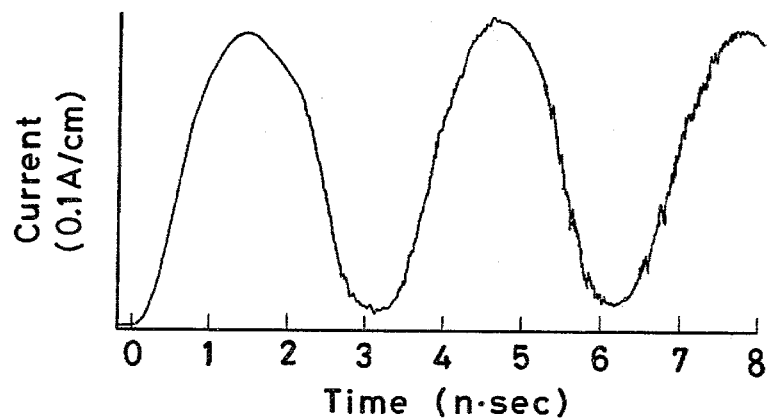

PLANAR SEMICONDUCTOR DEVICE

BACKGROUND OF THE INVENTION

This invention relates to a planar semiconductor device.

Heretofore, it has been known that a binary compound semiconductor such as GaAs exhibits an electron transfer effect under an electric field due to its multi-valley band structure and produces a high electric field domain therein with the result that current pulses or current oscillation will be generated. This semiconductor is therefore utilized as a Gunn diode and a microwave oscillator. Furthermore, GaAs has a wide forbidden gap and can itself be used an insulating material. Thus an active layer of GaAs of n-type is epitaxially grown on the insulating material as a substrate and electrodes are applied to the active layer in the planar form, thus enabling use of the formed element as a planar device (Transferred Electron Devices by P. J. Bulman et al 1972, Academic Press). Particularly, an element having a Schottky electrode at the center thereof as well as electrodes for bias application provided at opposite ends thereof has been developed as an ultra-high speed digital element in an integrated form. (GALLIUM ARSENIDE and RELATED COMPOUNDS (ST LOUIS) 1976, Inst. Phys. Conf. Ser. No. 33b, 1977, p245-253).

However, GaAs has certain drawbacks. For example, an electric field of as high as about 3 KV/cm is required to produce the above effect and therefore power consumption becomes high and high density integration becomes difficult. In order to eliminate these drawbacks, a ternary compound semiconductor of $Ga_yIN_{1-y}Sb$ was proposed. Measurement of the electrical performance of this semiconductor conducted by the inventors revealed that the threshold electric field at which a high electric field domain is produced is about 600 V/cm, which is one fifth of that for GaAs, and that power consumption is reduced to about one-thirtieth (GALLIUM ARSENIDE and RELATED COMPOUNDS (EDINBURGH) 1976, Inst. Phys. Conf. Ser. No. 33a, 1977, p296-305). Use is made of InSb or GaSb which have closely matching lattice constants to provide epitaxial growth on the above-mentioned semiconductor. However, neither of these two materials presents insulating characteristics at room temperature and thus cannot be used to form electrically separate elements in an integrated form to provide a planar structure as is possible in the case of GaAs. It was therefore impossible to manufacture a digital element with a gate electrode. Nevertheless, semiconductors of III-V compound having a narrow energy gap (For example, InSb, InAs, GaSb and such combinations thereof as $Ga_yIn_{1-y}Sb$, $GA_yIn_{1-y}Sb_yAs_{1-y}$ and $InAs_ySb_{1-y}$) have promising characteristics in connection with a number of possible applications such as:

(i) low-voltage microwave oscillators or low-power consumption high-speed logic elements, in view of the fact that they present a Gunn effect at a low electric field.

(ii) galvano-magnetic elements, in view of the large galvano-magnetic effect that results from their high mobility.

(iii) elements for emitting and detecting infrared rays in view of the fact that they have a band gap in the infrared region of wavelength 1.0 to 5.0 $\mu$m.

However, because of the big difference in lattice constant high quality crystals cannot be obtained by growth on semiconductors having a large energy gap such as InP and GaAs. Use of semiconductors having similar narrow energy gaps as the substrate is not successful because their low resistances do not allow electrical separation of elements. Integration is thereof difficult.

It is therefore an object of the present invention to provide a planar semiconductor device having a narrow energy band gap semiconductor as the active layer.

Another object of the present invention is to provide an integrated planar semiconductor device having a narrow energy band gap semiconductor as the active layer.

SUMMARY OF THE INVENTION

For attainment of the object of the invention, a crystalline layer of $Ga_xAl_{1-x}Sb$ compound semiconductor is formed on a GaSb substrate. The $Ga_xAl_{1-x}Sb$ compound semiconductor is stable for values of "x" of not less than 0.1 and will be a resistor of high resistance value when "x" is not more than 0.3 at room temperature. Accordingly, the $Ga_xAl_{1-x}Sb$ compound is formed on a substrate and, as a narrow energy band gap semiconductor has a similar crystalline structure to that of the above-mentioned compound and also has a similar lattice constant, it is possible to easily form a narrow energy band gap semiconductor of high quality on the semiconductor. By use of appropriate semiconductors, it is possible to manufacture planar Gunn effect devices, high electric field domain generating devices, Hall devices or optical devices in a miniaturized form at a low cost.

The other characteristics and advantages of the present invention will become apparent from the description given herein below with reference to the accompanying drawings.

BRIEF EXPLANATION OF THE DRAWINGS

FIG. 1 is a view showing the basic principle of the planar semiconductor device according to the invention, FIG. 2 is a graph showing the relation between the lattice constant and the energy gap of III-V compound semiconductors, FIG. 3 is an enlarged perspective view of a planar Hall array according to the invention, FIG. 4 is an enlarged perspective view of a planar infrared photo-detector array according to the invention, FIG. 9 is a pictorial cross-sectional view of a micro-photographic picture of a planar semiconductor device according to the invention, FIG. 10 is a graph showing one example of the anode triggering characteristics of a planar semiconductor device according to the invention, FIG. 11 is a current waveform showing one example of the oscillation of a planar semiconductor device according to the invention.

DESCRIPTION OF THE PREFERRED EMBODIMENTS

Figure 5:
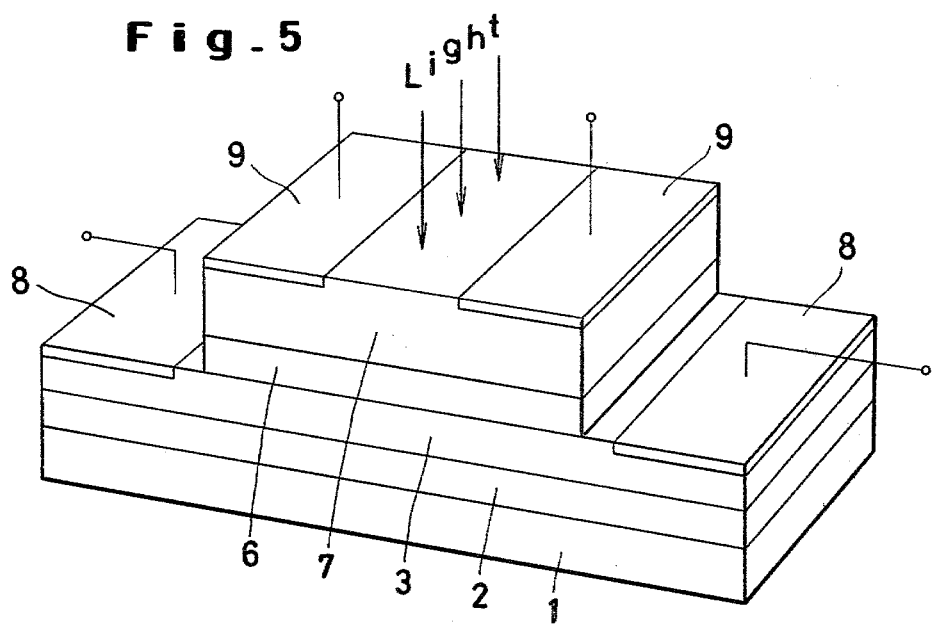
FIG. 5 is an enlarged perspective view of a planar multi-layer infrared photo-detector according to the invention.

FIG. 1 shows the basic structure of a planar semiconductor device according to the present invention. A GaSb semiconductor is used as a substrate 1 on which a crystalline layer 2 of $Ga_xAl_{1-x}Sb$ compound semiconductor is grown. Heretofore, it has been impossible to obtain a crystal of high quality by growing a semiconductor of narrow energy gap such as InAs, InSb and GaSb on a semiconductor of large energy gap such as InP or GaAs as shown in FIG. 2, as there is a big difference in lattice constant therebetween. GaSb and AlSb have lattice constants similar to each other but the bulk of AlSb is chemically unstable in the air. $Ga_xAl_{1-x}Sb$, which is a mixed crystal of GaSb and AlSb, will be stable when "x" is not less than 0.1 while the crystal will be resistor of high resistance value when "x" is not more than 0.3 since the energy gap thereof becomes larger than 1.3 eV. The GaSb which is used as the substrate is a resistor of low resistance value while $Ga_xAl_{1-x}Sb$ compound semiconductor grown on the GaSb will be a resistor of a high resistance value when "x" is 0.3 or less at room temperature and will form an effective insulating layer. However, there is a good match of lattice constant between $Ga_xAl_{1-x}Sb$ and GaSb, so that crystal of high quality will grow on the GaSb. Any known crystal growing methods such as the liquid-phase epitaxial method, the vapor epitaxial method and the molecular beam method can be employed for crystal growth.

The lattice constant of the insulating layer 2 [$Ga_xAl_{1-x}Sb$ ($0.1<x<0.3$)] thus formed on the GaSb substrate 1 falls in the range of from 6.1 Å to 6.15 Å as shown in FIG. 2. Therefore, it is possible to form on the insulating layer a narrow energy band gap semiconductor of III-V compound as an active layer, having a lattice constant which, being in the range of from about 6.04 Å to about 6.2 Å, is within ±1% of the lattice constant of the insulating layer. As a consequence, an active layer formed of high-quality crystals can be easily grown on the insulating layer 2 and the thickness thereof can be accurately controlled to fall in the range of from less than a micron up to a few hundred microns.

As the narrow energy band gap semiconductor of III-V compound having a lattice constant between about 6.04 Å and about 6.2 Å, there may, for example, be used $Ga_yIn_{1-y}Sb$ ($0.7<y<0.8$), $InAs_ySb_{1-y}$ ($0.7<y<1$) and $Ga_yIn_{1-y}Sb_yAs_{1-y}$ ($0<y<1$). Accordingly, various planar semiconductor devices can be obtained by selecting a semiconductor from these compounds, forming the selected semiconductor as an active layer 3 on an insulating layer 2 and forming desired electrodes 4, 5 on the active layer 3. For example, a planar Gunn effect device can be obtained by using $Ga_yIn_{1-y}Sb$ ($0.7<y<0.8$) of n-type as the narrow energy band gap semiconductor presenting an electron transfer effect and an active layer 3 of this material on an insulating layer 2 and then forming ohmic bias electrodes 4 on opposite ends of the active layer 3.

In case where this narrow energy band gap semiconductor is to be used as a digital signal processing device, $Ga_xAl_{1-x}Sb$ of p-type is locally formed on the surface of the $Ga_yIn_{1-y}Sb$ layer between the bias electrodes 4 to provide a gate electrode 5 and a high electric field domain can be produced in the active layer 3 by application of a negative signal voltage to the gate electrode 5.

A Hall array device is fabricated by using as a narrow energy band gap semiconductor $InAs_ySb_{1-y}$ of n-type ($0.7<y<1$) which is a high mobility semiconductor as an active layer 3 and by forming current electrodes 4, 4' and a Hall electrode 5 on the active layer 3 as shown in FIG. 3. In actual fabrication, an active layer 3 is grown on the insulating layer 2 after an insulating layer 2 is grown on a GaSb substrate 1. Separation of the respective elements is effected by a chemical etching process, an ion etching process or other known method. An electrode 4 is formed on the active layer 3. $SiO_2$ and other insulating materials are attached onto the electrode 4 and electrical separation is effected to form an electrode 4' and Hall electrode 5. In this manner, there is obtained a Hall array device such as a magnetic bubble detector element or the like.

It is also possible to produce an infrared detector in the form of an array by using semiconductors for infrared rays such as $Ga_yIn_{1-y}Sb_yAs_{1-y}$ ($0<y<1$) as the narrow band gap semiconductor, by separating the elements by means of a known etching method and by forming electrodes 4 on the elements as shown in FIG. 4.

Various other kind of multi-layer devices can also be realized in accordance with the present invention. For example, as shown in FIG. 5, $Ga_yIn_{1-y}Sb_yAs_{1-y}$ layer 3 (the composition of which is rather close to InAs) is formed on an insulating layer 2 as the narrow energy band gap semiconductor and an insulating layer 6 is formed thereon and $Ga_yIn_{1-y}$-$Sb_yAs_{1-y}$ layer 7 (composition of which is rather close to GaSb) is formed on the insulating layer 6. When electrodes 8 and 9 are formed on thus formed active layers 3 and 7 respectively, the element will constitute a two-band infrared detector in the region of 1.7 to 3.8 μ.

In a similar manner, it is possible to produce a multi-band infrared detector by forming any number of alternate insulating and light-passing layers of different wavelength.

Figure 6:
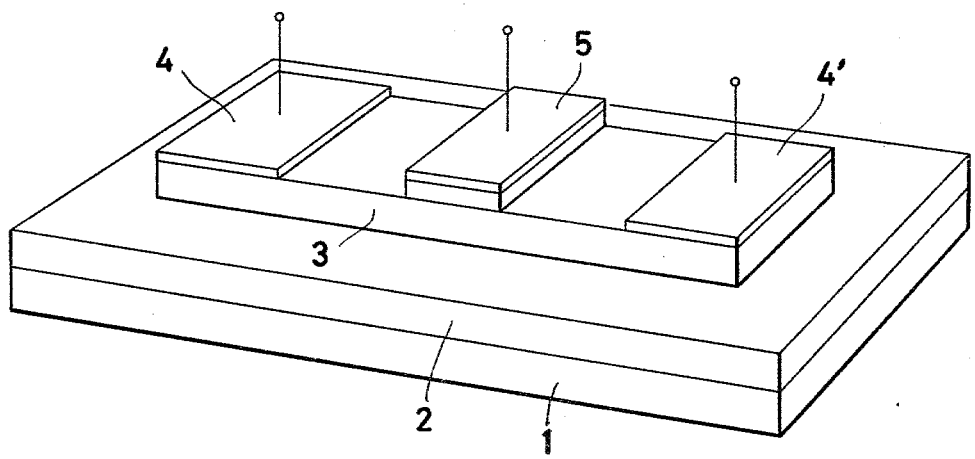
FIG. 6 is an enlarged perspective view showing a planar FET device according to the invention.

FIG. 6 shows an embodiment constructed to function as an FET. An FET can be obtained by forming a very thin active layer 3 of $Ga_yIn_{1-y}Sb$ on $Ga_xAl_{1-x}Sb$ layer 2 and providing electrodes 4, 4', 5 (the source electrode 4 and the drain electrode 4' being metal ohmic electrodes and the gate electrode 5 being $Ga_xAl_{1-x}Sb$ formed on $Ga_yIn_{1-y}Sb$), and applying a negative voltage to the gate electrode 5.

In order to grow a narrow energy gap semiconductor active layer 3 on a $Ga_xAl_{1-x}Sb$ insulating layer 2 in this manner, use may be made of any known crystal growing method such as the liquid-phase epitaxial growing method, the vapor epitaxial growing method and the molecular beam epitaxial growing method.

Figure 7:
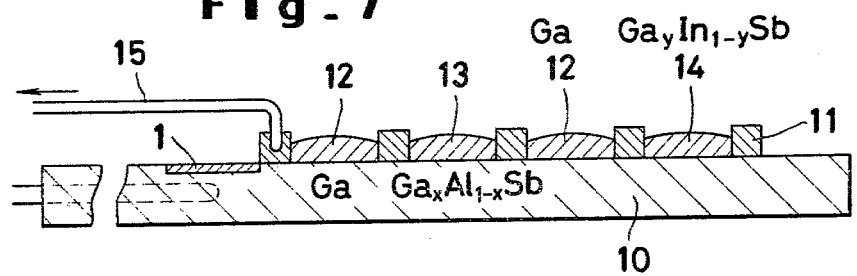
FIG. 7 is an explanatory view showing one embodiment of the manufacturing method for planar semiconductor devices according to the invention.

In liquid-phase epitaxial growth, use is made of, for example, a crucible unit shown in FIG. 7. A GaSb wafer 1 serving as the substrate for growth is placed on a crucible 10 and a number of crucibles 11 slidably carried thereon are filled with a substrate cleaning solution Ga 12 and a solution of $Ga_xAl_{1-x}Sb$ 13 and a solution of $Ga_yIn_{1-y}Sb$ 14 are arranged to move along the surface of the crucible 10 by an operating rod 15 connected to one of them.

Figure 8:
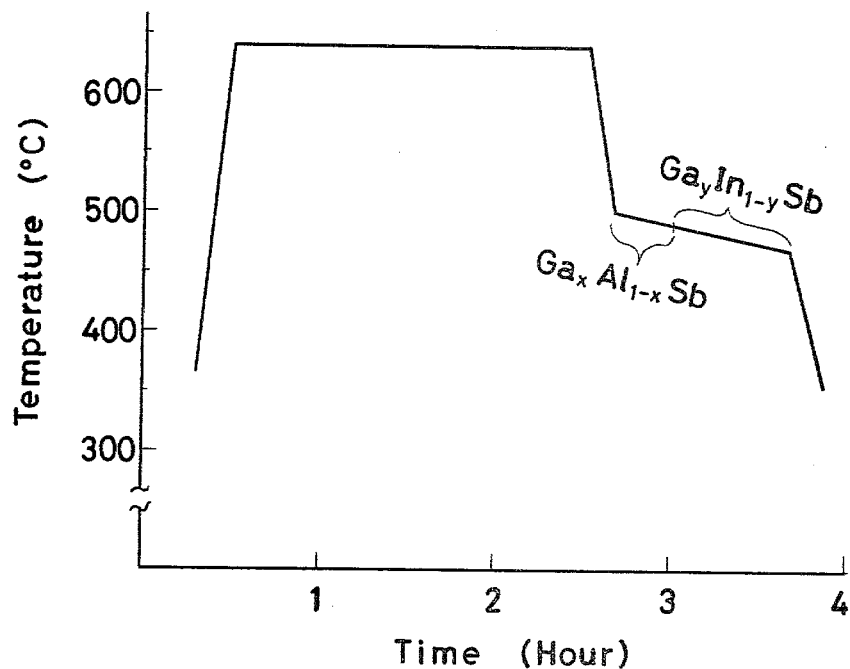
FIG. 8 is an explanatory view showing one example of the temperature programming associated with the manufacturing method shown in FIG. 7.

The crucible unit as shown in FIG. 7 is put into a furnace which is temperature-programmed as shown in FIG. 8 and then the crucible is moved so that the GaSb substrate 1 sequentially comes in contact with the solutions to effect cleaning and growth. Thickness and composition of the grown layer can be controlled by the temperature programming and the composition of the solutions.

FIG. 9 is a section of the crystal grown on a GaSb (100) substrate with a solution composed of $Ga_{0.90}Al_{0.09}Sb_{0.01}$ and $Ga_{0.38}In_{0.46}Sb_{0.16}$. Growth was conducted during the operation of the crucible according to the temperature program of FIG. 8. That is to say, each of the solutions was held at a temperature of 640° C. in highly pure hydrogen for two hours, was then cooled to 500° C. and was thereafter cooled at a constant cooling rate of 0.5° C./min. In the first step, the substrate was brought into contact with Ga at the temperature of 500° C. for five seconds to dissolve and to clean away mechanically damaged portions of the substrate surface and impurities adhering thereto, and the substrate was then contacted with the $Ga_{0.90}Al_{0.09}Sb_{0.01}$ solution for crystal growth and cooled from 500° C. to 490° C. so as to grow $Ga_{0.90}Al_{0.09}Sb_{0.01}$ to a thickness of about 12 μm. The crucibles were again moved to bring the substrate into contact for five seconds with fresh Ga for cleaning so that the small amount of $Ga_{0.90}Al_{0.09}Sb_{0.01}$ solution remaining on the surface of the grown layer was washed off. Next, the substrate was brought into contact with $Ga_{0.38}In_{0.46}Sb_{0.16}$ solution and cooled from 490° C. to 470° C., so that an active layer of $Ga_{0.38}In_{0.46}Sb_{0.16}$ was grown on the $Ga_{0.90}Al_{0.09}Sb_{0.01}$ layer to a thickness of about 35 μm. In the last step, the crucibles was moved to separate the substrate from the $Ga_{0.38}In_{0.46}Sb_{0.16}$ solution.

FIG. 10 illustrates an example of the anode-triggering characteristics of an element having the structure shown in FIG. 1 ($Ga_{0.8}In_{0.2}Sb$ is used as the active layer) and switching operation of the current flowing in the element is shown in the drawing. A gate pulse (bias voltage) was applied to the element and current flowing therethrough was observed over a range of bias voltages. By FIG. 10(B) is represented a waveform in the case where the bias voltage is low and no Gunn effect occurs while by FIG. 10(A) is represented a waveform in the case where the bias voltage is high and a Gunn effect occurs and current switching takes place due to the gate pulse. Transient switching time is very small and in fact is less than 200 picoseconds.

FIG. 11 shows the current waveform of an oscillating element which consists of an element with the structure of FIG. 1 combined with an integrated resonator of planar type. The element oscillates at a frequency of 400 MHz. This element can be used as a memory element for an ultra-high speed logic element whose oscillating condition is controlled at its gate.

Figure 12:
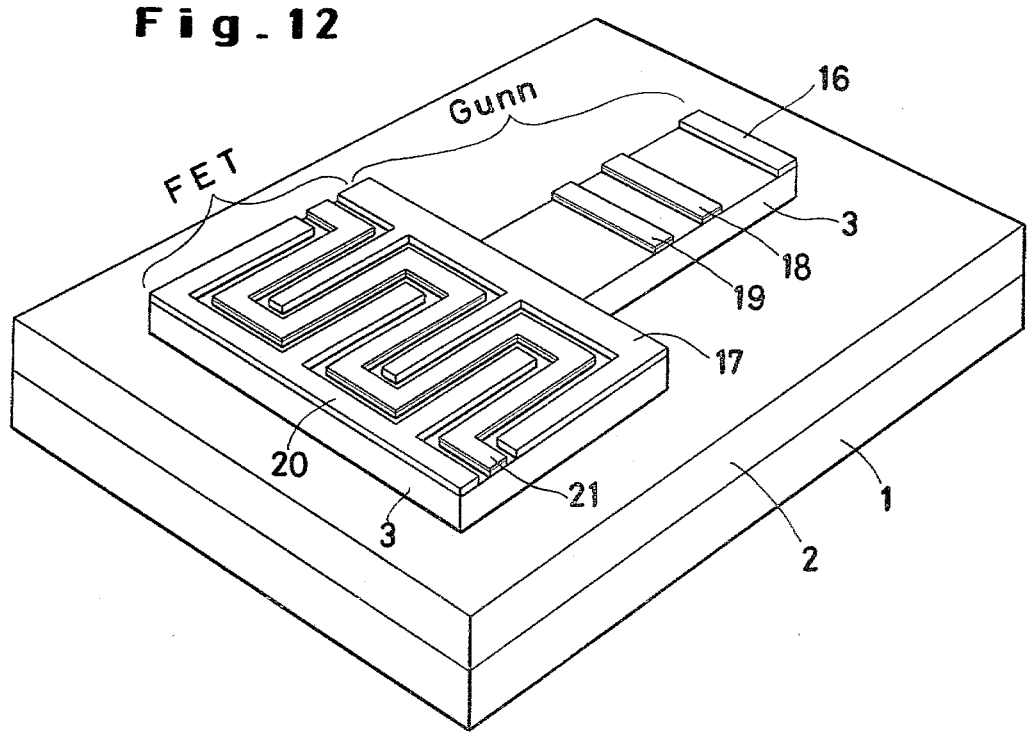
FIG. 12 is a perspective view showing one embodiment of a composite element for high speed logic operation.

FIG. 12 shows an integrated device for high speed logic operation. The device has a structure which takes advantage of the large output and high speed performance of a Gunn effect planar element and of the high sensitivity of a junction type field effect transistor.

Referring to FIG. 12, an insulating layer 2 of $Ga_xAl_{1-x}Sb$ is first grown on a GaSb substrate 1 and a T-shaped active layer 3 of $Ga_yIn_{1-y}Sb$ is thereafter grown on the insulating layer 2. A metal anode electrode 16 and a metal cathode electrode 17 are formed respectively at the bottom and top of the stem of the T-shaped active layer 3. On the $Ga_yIn_{1-y}Sb$ layer 3 separating these electrodes 16, 17 are formed two separate local layers 18, 19 of $p-Ga_xAl_{1-x}Sb$, one of which is used as an input electrode (trigger) and the other of which is used as an output electrode, thereby forming a planar Gunn device. The metal cathode electrode 17 of the planar Gunn device is formed in the shape of a comb and also serves as the metal anode electrode (drain) of a planar FET formed of itself, a comb-shaped metal cathode electrode (source) 20 is formed to be opposed to the metal cathode electrode 17 and a $p-Ga_xAl_{1-x}Sb$ layer 21 is formed between the electrodes 17 and 20 and serves as the gate electrode.

In this integrated device comprising a Gunn device and an FET, when an input signal is applied to the gate electrode 21 of the FET, the resultant output signal is applied to the cathode electrode 17 of the Gunn device (the drain electrode of the FET) and the output signal of the Gunn device is obtained at the output electrode 19. If with this arrangement, a signal is introduced through the trigger electrode 18 of the Gunn device, the output of the Gunn device will be the result obtained by a logic operation on this signal and the signal applied to the gate electrode 21 of the FET.

As is seen from the above description, it has become possible to fabricate a narorw energy band gap semiconductor in the planar form, which was difficult to realize heretofore, by forming an insulating intermediate layer on a substrate at the stage of crystal growth. Accordingly, it becomes possible to fabricate in the planar form, for example, high speed Gunn logic elements which are operative at a low voltage and two-dimensional array elements for near infrared radiation. Moreover, the devices themselves can be miniaturized and integrated and reduction in cost can be realized.

What is claimed is:

1. Planar semiconductor device comprising:
   a GaSb substrate,
   a crystalline growth layer of a $Ga_xAl_{1-x}Sb$ compound semiconductor formed on said GaSb substrate where x ranges between 0.1 and 0.3,
   an active layer of a narrow energy band gap semiconductor formed on said crystalline growth layer, said narrow energy band gap semi-conductor being a III-V compound semiconductor having a lattice constant of between about 6.04 Å and about 6.2 Å, and consisting of one member selected from the group consisting of $Ga_yIn_{1-y}Sb$ $(0.7 < y < 0.8)$, $In As_ySb_{1-y}$ $(0.7 < y < 1)$ and $Ga_yIn_{1-y}Sb_yAs_{1-y}$ ($0 < y < 1$), and
   electrodes formed on said active layer in the planar form.

2. Planar semiconductor device as set forth in claim 1 wherein said electrodes are metal.

3. Planar semiconductor device as set forth in claim 2 wherein said electrodes are formed on said narrow energy band gap semiconductor through n-type $Ga_xAl_{1-x}Sb$ where x ranges between 0.1 and 0.3.

4. Planar semiconductor device as set forth in claim 2 wherein said electrodes are formed on said narrow energy band gap semiconductor through p-type $Ga_xAl_{1-x}Sb$ where x ranges between 0.1 and 0.3.

5. Planar semiconductor device as set forth in claim 1 wherein said electrodes are formed on opposite ends of said active layer.

6. Planar semiconductor device as set forth in claim 5 further comprising:

a crystalline growth layer of a $Ga_xAl_{1-x}Sb$ compound semiconductor provided on said active layer where x ranges between 0.1 and 0.3,
an active layer of a narrow energy band gap semiconductor formed on said crystalline growth layer, and
a pair of electrodes provided on opposite ends of said active layer.

* * * * *